(12) United States Patent
Low et al.

(10) Patent No.: US 7,179,683 B2
(45) Date of Patent: Feb. 20, 2007

(54) SUBSTRATE GROOVES TO REDUCE UNDERFILL FILLET BRIDGING

(75) Inventors: Al Ling Low, Kedah (MY); Yee Hao Ho, Taman Sri Angsana (MY); Yew Wee Cheong, Penang (MY); Wei Keat Loh, Penang (MY)

(73) Assignee: Intel Corporation, Santa Clara, CA (US)

( * ) Notice: Subject to any disclaimer, the term of this patent is extended or adjusted under 35 U.S.C. 154(b) by 193 days.

(21) Appl. No.: 10/927,568

(22) Filed: Aug. 25, 2004

(65) Prior Publication Data

US 2006/0046352 A1   Mar. 2, 2006

(51) Int. Cl.
*H01L 21/00*   (2006.01)
*H01L 23/48*   (2006.01)
*H01L 23/52*   (2006.01)

(52) U.S. Cl. .................... 438/108; 438/125; 438/126; 257/778; 257/E23.021

(58) Field of Classification Search ............... 438/108, 438/125–126; 257/778, E23.021
See application file for complete search history.

(56) References Cited

U.S. PATENT DOCUMENTS

| | | | | |
|---|---|---|---|---|
| 5,218,234 A | * | 6/1993 | Thompson et al. ......... 257/787 |
| 5,558,267 A | * | 9/1996 | Humphrey et al. ......... 228/4.5 |
| 5,629,566 A | * | 5/1997 | Doi et al. .................... 257/789 |
| 5,855,821 A | * | 1/1999 | Chau et al. .................. 252/514 |
| 6,291,264 B1 | * | 9/2001 | Tang et al. .................. 438/106 |
| 6,426,565 B1 | * | 7/2002 | Bhatt et al. .................. 257/783 |
| 6,448,507 B1 | * | 9/2002 | Fontecha et al. ........... 174/260 |
| 6,853,089 B2 | * | 2/2005 | Ujiie et al. .................. 257/783 |
| 2002/0084518 A1 | * | 7/2002 | Hasebe et al. .............. 257/676 |
| 2005/0051885 A1 | * | 3/2005 | Weng et al. ................. 257/687 |

* cited by examiner

*Primary Examiner*—Luan Thai
(74) *Attorney, Agent, or Firm*—Blakely, Sokoloff, Taylor & Zafman LLP

(57) ABSTRACT

An apparatus having and method of forming grooves in the surface of a substrate adjacent and parallel to sidewall locations for circuit chips or die mounted on the surface. The grooves have physical dimensions to retain fill material formed between the packages and the surface of the substrate so that the fill material does not bridge between chips, thus reducing warping of the substrate due to mismatches in coefficient of thermal expansion (CTE) between the fill material, the substrate, the chips, and mold material formed over the substrate, under fill, and chips.

27 Claims, 2 Drawing Sheets

SUBSTRATE GROOVES TO REDUCE UNDERFILL FILLET BRIDGING

BACKGROUND

1. Field

Electronic device packages and the manufacture thereof.

2. Background

Integrated circuit (IC) chips or die are typically assembled into a package that is soldered to a printed circuit board (PCB). A chip or die may have contacts on one surface (e.g., such as a field or array of contacts) that are electrically connected to a first set of contacts on one surface of an electronic device package (e.g., such as a chip or die package), and there may be another set of contacts on the package for connection to a PCB, such as a mother board. Thus, a circuit device, such as a chip or a die can be assembled into a package on a substrate, strip, or wafer having multiple packages. Once the packages are assembled, each package may be separated from the other packages and subsequently attached to a PCB. Electronic access to and operation of circuit devices, such as circuit devices on a semiconductor (e.g., silicon) substrate, may be provided by one set of solder balls and/or contact wires between the circuit device and a circuit device package, and a second set of solder balls between the package and contacts of another electronic device (e.g., such as a PCB).

During manufacture and assembly, such a package may experience thermal variation and vertical tensile strain. In addition, the package may include materials having various coefficients of thermal expansion (CTE). For example, multiple packages may be formed or mounted on a substrate, strip, or wafer by mounting a circuit device at each of the package locations, filling the space between the circuit device and the location with an underfill material, and then coating the circuit device and location with a mold material. Subsequently, each package location including the circuit device mounted therein, may be singulated or separated from the other packages and to form a single package for attaching to a PCB or mother board. Therefore, there may be CTE mismatches between a substrate on which packages are manufactured (e.g., such as a substrate on which multiple circuit devices are assembled to multiple package locations, underfilled, and molded), the circuit devices themselves, the underfill material (e.g., material to fill the gap between the circuit devices and the substrate), and the mold material (e.g., such as material to seal out moisture, formed over the circuit devices, package locations, and fill material). Thus, a substrate having a number of packages formed thereon at package locations may experience warping or bowing depending on the degree of CTE mismatches between the materials mentioned above, the thicknesses of the materials, the number of packages formed on the substrate, the space between the packages, and the number and intensity of thermal variations experienced during manufacture of the packages and assembly of the circuit devices to the packages. This warping may cause delamination or bowing of layers of the package and of the circuit devices assembled into the packages.

Moreover, after formation of the packages (e.g., formation of the packages to include the circuit devices at each package location), it may be difficult to singulate or separate the packages from one another without damaging the packages or circuit devices in the packages because of the warping or bowing of the multi-package substrate due to CTE mismatches and thermal variations as described above. For example, during singulation, the force used to compress or flatten a warped substrate having multiple packages, prior to separating the packages, may damage the packages or circuit devices in the package. Therefore, it is generally desirable to manufacture a substrate of multiple packages having reduced warpage or bowing prior to, during, and after assembling circuit devices into the packages.

BRIEF DESCRIPTION OF THE DRAWINGS

Various features, aspects and advantages will become more thoroughly apparent from the following detailed description, the set of claims, and accompanying drawings in which:

DETAILED DESCRIPTION

Figure 1:
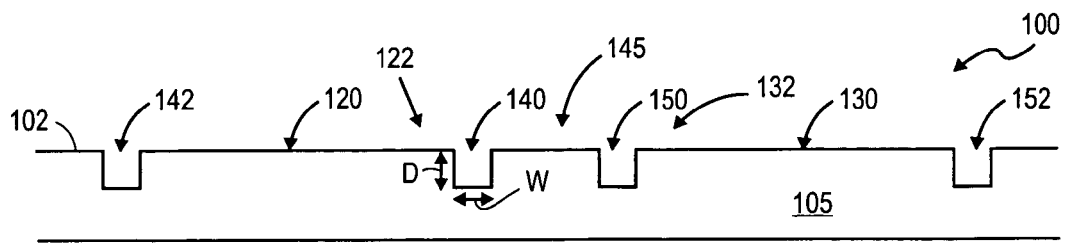
FIG. 1 is a schematic cross-sectional view of a substrate having a number of package locations at which to form circuit device packages.

FIG. 1 is a schematic cross-sectional view of a substrate having a number of package locations at which to form circuit device packages. FIG. 1 shows apparatus 100 having substrate 105 with surface 102. Substrate 105 may be part of and/or have locations at which to form a number of chip packages, die packages, IC packages, circuit device packages, semiconductor packaging devices, flip chip packages for circuit devices, flip chip molded array packages (FCM-MAP), or a strip, cluster, or array of packages thereof. Thus, substrate 105 may be a substrate on which multiple circuit devices will be mounted to form multiple packages at package locations or circuit device mounting locations. For example, substrate 105 may include clusters, strips, or a substrate on which is to be formed multiple packages for packaging circuit devices, electronic devices, IC semiconductor electronic devices, transistors, memories, processors, microprocessors, digital signal processors, central processing units (CPUs), silicon chips, silicon die or other electronic components as described herein.

Substrate 105 may be made of a packaging material through which interconnects, such as electronically conductive metal lines, connect contacts on the top surface of substrate 105 with contacts on the bottom surface of substrate 105. Specifically, substrate 105 may be made of a plastic material, and/or a polyamide material. Thus, substrate 105 may include a number of areas or locations at which a circuit device such as a chip or a die is to be mounted or bounded to form a package to package the circuit device for interfacing the circuit device with another electronic device (e.g., such as a PCB). Substrate 105 may be a substrate having a thickness between 30 microns (µm) and 500 µm in thickness, such as by having a thickness of 280 µm, 290 µm, 300 µm, 308 µm, 315 µm, or 325 µm.

FIG. 1 also shows circuit device mounting location 120, and circuit device mounting location 130. For example, circuit device mounting locations 120 and 130 may be locations at which a package is to be formed, such as by mounting a circuit device at the package location, electrically connecting the circuit device to the location, filling the space between the circuit device and location with underfill, and forming a molding over the circuit device, underfill, and location. Mounting locations 120 and 130 may be package locations for forming a package to be singulated from substrate 105 and connected to a PCB. Thus, the package and circuit device mounted therein may be part of an electronic system such as a computer (e.g., desk top, lap top, hand-held, server, Internet appliance, etc.), a wireless communication device (e.g., cellular telephone, cordless telephone, pager, etc.), a computer-related peripheral (e.g., printer, scanner, monitor, etc.), an entertainment device (e.g., a television, a radio, a stereo, a compact disc player, a MP3 player, or other piece of audio equipment), a digital video disc player, a video recorder, a video camera, a digital camera, and the like.

To either side of circuit device mounting location 120, there may be a groove, recess, indentation, or drain, such as a sufficient groove for receiving material formed on surface 102. For example, FIG. 1 shows groove 142 and groove 140 to either side of circuit device mounting location 120. Similarly, FIG. 1 shows groove 150 and groove 152 to either side of circuit device mounting location 130. Although FIG. 1 shows grooves 140, 142, 150, and 152 on either side of locations 120 and 130, according to embodiments, there may be a groove, such as groove 142, to one side, on two sides, on three sides, on four sides, and/or completely surrounding of a circuit device mounting location, such as location 120 (e.g., such as by a single groove that continues around mounting location 120 forming a polygon or curved shape on surface 102). In one instance, two separate continuous grooves may be formed, one around each of mounting locations 120 and 130, thus surrounding each of the mounting locations like a mote. Grooves 140, 142, 150, and 152 may be formed by an etch process, a patterned and etch process, a screen printed process, patterning subtraction, or a laser to remove a portion of surface 102 of substrate 105.

According to embodiments, groove 140 may be formed or be located in surface 102 adjacent, parallel, or towards circuit device mounting location 130 from sidewall location 122, where sidewall location 122 is a location for a sidewall of a circuit device to be mounted at circuit device mounting location 120. Similarly, groove 150 may be located or formed adjacent or parallel to sidewall location 132 of a sidewall of a circuit to be mounted at circuit device mounting location 130. FIG. 1 also shows groove 140, which may have depth D between 0.005 mm and 0.3 mm below surface 102 of substrate 105, such as by having depth 0.01 mm, 0.05 mm, 0.1 mm, 0.05 mm, 0.2 mm, or 0.25 mm. Similarly, FIG. 1 shows groove 140, which may have width W between 0.005 mm and 0.3 mm, such as by having depth 0.01 mm, 0.05 mm, 0.1 mm, 0.05 mm, 0.2 mm, or 0.25 mm. According to embodiments, groove 140 may have depth D and width W large enough to prevent material (e.g., such as epoxy underfill) of chips, die, or circuit devices mounted at circuit device mounting locations 120 and 130 from overlapping between/among those circuit devices. Specifically, groove 140 may have depth D and width W large enough to prevent underfill material of circuit devices mounted at circuit device mounting locations 120 and 130 from overlapping between packages formed at the mounting locations when the circuit devices are mounted and underfilled.

In addition, channel 145 may be defined as a space between circuit device mounting location 120 and circuit device mounting location 130. Thus, groove 140 and/or groove 150 may be formed along channel 145.

Figure 2:
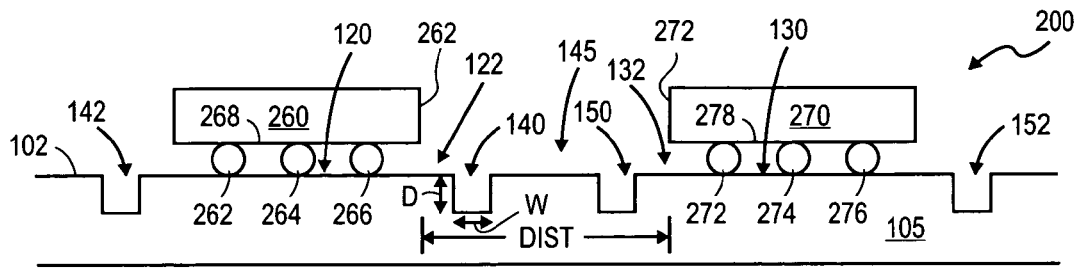
FIG. 2 shows the structure of FIG. 1 after forming or mounting circuit devices at circuit device locations.

Thus, FIG. 2 shows the structure of FIG. 1 after forming or mounting circuit devices at circuit device locations. FIG. 2 shows apparatus 200 including circuit device 260 (e.g., such as a circuit device, chip, die, and/or a silicon chip) mounted at circuit device location 120, and circuit device 270 (e.g., such as a circuit device, chip, die, and/or silicon chip that may be the same or different than circuit device 260) mounted at circuit device mounting location 130. Thus, circuit devices 260 and 270 may be circuit devices to be connected and electronically interfaced to a substrate, PCB, or other electronic device.

Circuit device 260 includes bottom surface 268, such as a surface having contacts for attaching and electrically coupling to solder balls 262, 264, and 266. In turn, surface 102 of substrate 105 may include contacts for attaching and electrically coupling to solder balls 262, 264, and 266. Thus, contacts on bottom surface 268; solder balls 262, 264, and 266; and contacts on surface 102 may form an electronically conductive connection between the contacts on bottom surface 268 and the contacts on surface 102, where the connection is sufficient for sending or conducting signals, ground, or bias voltages from circuit device 260 (e.g., such as a chip or die) and substrate 105 (e.g., such as a chip or die package). Similarly, circuit device 270 has bottom surface 278 that may have contacts for attaching to and electrically connecting to solder balls 270, 274, and 276. Consequently, solder balls 272, 274, and 276 may be attached to and electrically connected to contacts at surface 102 at substrate 105. Solder balls 262 through 266 and 272 through 276 may be formed of a conductive material, such as a metal, a copper, an alloy, an aluminum, a gold, a silver, or other appropriate conductor. Solder balls 262 through 266 and 272 through 276 may be formed of an appropriate process for forming solder balls of such conductive material. In addition to solder balls 262, 264, and 266, it is also contemplated that other appropriate devices, structures, and/or methods may be used to electrically couple contacts on bottom surface 268 to contacts on surface 102 to form an electronically conductive connection between selected pairs of those contacts. For example, wires, conductive adhesive, and/or solder may be used.

FIG. 2 also shows sidewall 262 of circuit device 260 adjacent, proximate, parallel, and/or at sidewall location 122. For instance, sidewall location 122 may be directly below and aligned with the surface of sidewall 262, such that circuit device 260 is disposed at location 120 and extends to but not beyond sidewall location 122. Correspondingly, sidewall 272 of circuit device 270 is adjacent to or at sidewall location 132.

The height between bottom surfaces 268 and 278, and surface 102 will depend on the size of solder balls 262 through 266 and solder balls 272 through 276, respectively. The size, formation, and material of solder balls 262 through 266 and 272 through 276 are sufficient for attaching circuit devices 260 and 270 herein to substrate 105. Solder balls 262 through 266 and 272 through 276 may have a height of between 70 µm and 80 µm, such as a height of 70 µm, 72 µm, 74 µm, 76 µm, 78 µm, or 80 µm.

FIG. 2 also shows distance DIST between circuit device 260 and circuit device 270 (e.g., such as a distance between sidewall 262 and sidewall 272). According to embodiments, distance DIST may be a distance of between 1 millimeter (mm) and 4 millimeters, such as a distance of 2.25 mm, 2.5 mm, 2.75 mm, 2.8 mm, 2.9 mm, 3.0 mm, 3.1 mm, 3.2 mm, 3.25 mm, 3.5 mm, and 3.75 mm.

Figure 3:
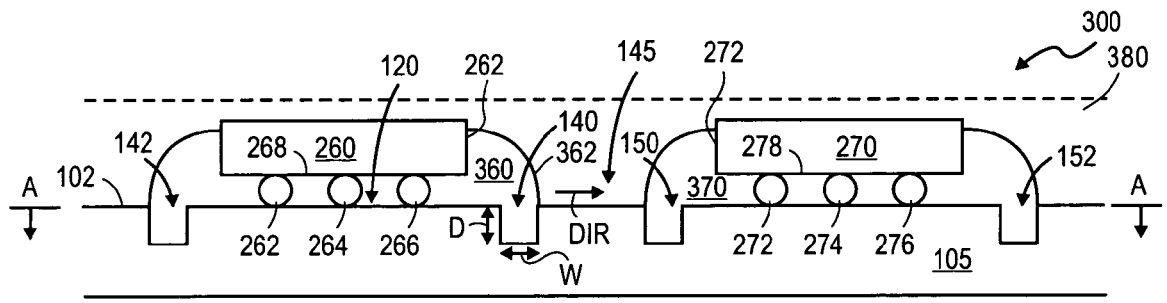
FIG. 3 shows the structure of FIG. 2 after forming fill material between the circuit devices and the substrate surface.

FIG. 3 shows the structure of FIG. 2 after forming fill material between the circuit devices and the substrate surface. FIG. 3 shows fill material 360 on sidewall 262, surface 102, bottom surface 268, between bottom surface 268 and surface 102, in groove 142, and in groove 140. FIG. 3 also shows fill material 370 on sidewall 272, surface 102, bottom surface 278, between bottom 278 and surface 102, in groove 152, and in groove 150. It is considered that fill material 360 may cover all, a portion, or none of sidewall 262, bottom surface 268, surface 102, groove 142, and/or groove 140. For example, fill material 360 may cover a portion of bottom surface 268 and a portion of surface 102 under circuit device 260 to form a sufficient attachment between circuit device 260 and substrate 105, such as to protect solder bumps 262 through 266 and to absorb stress (e.g., such as vertical tensile stress) between circuit device 260 and surface 102 of substrate 105. The thickness of fill material 360 between circuit device 260 and substrate 105 may be similar to the distance described above with respect to the distance between bottom surface 268 and surface 102. For example, the thickness of fill material 360 between circuit device 260 and substrate 105 may be between 70 μm and 80 μm, such as by having a thickness of 70 μm, 72 μm, 74 μm, 76 μm, 78 μm, or 80 μm. In addition, as shown in FIG. 3, fill material 360 may be formed to height H (e.g., such as by having a thickness equal to height H) beside or on one side of circuit device 260, such as on sidewall 262 or at sidewall location 122. Appropriate heights for height H are between 75 μm and 750 μm, such as by having a height of 100 μm, 200 μm, 300 μm, 400 μm, 500 μm, 600 μm, or 700 μm. It can be appreciated that height H may vary according to the height of the solder balls and the height of the circuit device (e.g., such as the die or chip being packaged).

According to embodiments, fill material 360 may be deposited by dispensing material 360 at one side of circuit device 260, such as at sidewall 262 or sidewall location 122 and allowing fill material 360 to fill the space between bottom surface 268 and surface 102 below circuit device 260 through capillary action. For example, fill material 360 may be injected between surface 268 and surface 102 at the gap between those surfaces exposed at a side of device 262 (e.g., such as by injecting fill material 360 into the space between surface 268 and surface 102 at location 122 to fill the space between device 262 and surface 102).

Fill material 360 may be or include one or more of an epoxy, a resin, or an epoxy resin. Moreover, fill material 360 may be formed of an underfill fillet material, a capillary fill material, or by an underfill fillet process or a capillary filling process. It is also to be appreciated that fill material 360 may have a coefficient of thermal expansion (CTE) that is different than that of substrate 105 and/or circuit device 260 (e.g., such as by fill material 360 having a CTE greater than the CTE of substrate 105).

For example, according to embodiments, fill material 360 may be formed in or on all of or a portion of groove 140 and/or groove 142. Moreover, it is contemplated that fill material 360 may be formed in or on a portion of channel 145, but that a portion of surface 102 of substrate 105 in channel 145 may be left exposed after formation of fill material 360 is completed (e.g., such as exposed by not being covered by fill material 360). It can be appreciated that fill material 370 may be formed by a process, of a material, having a size, having a thickness, and otherwise similarly as described herein with respect to fill material 360.

Figure 4:
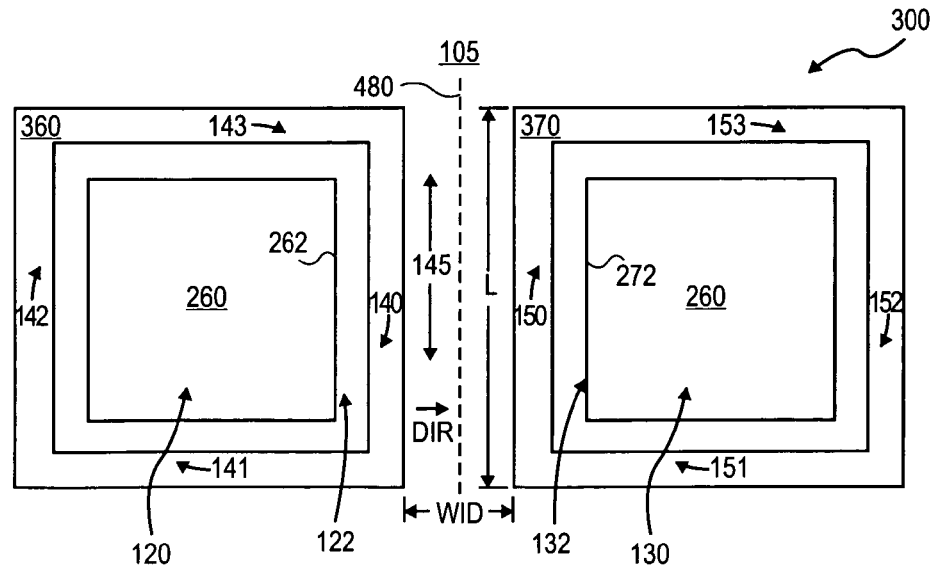
FIG. 4 is a schematic cross-sectional view of FIG. 3 from perspective "A".

It is also considered that surface 102 between grooves 140 and 150 may be exposed, such as by not being covered by either fill material 360 or fill material 370. For example, FIG. 4 is a schematic cross-sectional view of FIG. 3 from perspective "A". FIG. 4 shows channel 145 running parallel to sidewalls 262 and 272 and between circuit devices 260 and 270.

According to embodiments, forming fill materials 360 and/or 370 may include forming a sufficient amount of fill materials 360 and/or 370 in grooves 140 and 150 to restrain the fill materials from bridging channel 145, such as to restrain or prohibit fill material 360 from expanding towards fill material 370, and to restrain or prohibit fill material 370 from expanding towards fill material 360, thus causing fill materials 360 and 370 not to bridge to or contact each other. Thus, according to embodiments, fill materials 360 and 370 may be formed so that a portion of channel 145 is exposed (e.g., such as a width WID of channel 145 extending length L between groove 140 and groove 150). However, it is also considered that fill materials 360 and 370 may bridge channel 145 between width WID of grooves 140 and 150, so long as at locations along length L, a portion or portions of width WID channel 145 between groove 140 and groove 150 are exposed (e.g., such as by not being covered at "islands" along locations channels 145). More particularly, fill material 360 may be formed by draining or forming a portion of fill material 360 into groove 140 so that a surface tension of surface 362 of fill material 360, as shown in FIG. 3, restrains, or holds fill material 360 from expanding in direction DIR sufficiently to contact or bridge fill material 370 (e.g., such as prohibiting contact or bridging along a portion or all of width WID of channel 145 along length L). Thus, a surface tension of fill material 360 may be created at surface 362 between sidewall 262 and surface 102 of substrate 105, such as at groove 140 (e.g., such as by part of fill material 360 being drained or formed in groove 140) to restrain or hold fill material 360 from contacting fill material 370. In one example, groove 140 reduces the area of surface 102 in channel 145 that fill material 360 covers when material 360 is formed using capillary underfills (CUF), by using the surface tension within groove 140 to hold fill material 360 from forming a joint or contacting adjacent CUE material, such as fill material 370. It is also noted and considered that groove 140 may have a volume that reduces the amount of fill material 360 that can extend in direction DIR, because the volume of groove 140 consumes a portion of fill material 360.

Groove 140 may have a physical dimension (e.g., such as a depth, width, and cross-sectional shape) with respect to the axis of channel 145 as shown in FIG. 4, and a volume to reduce extension in direction DIR of fill material 360 on surface 102 beyond groove 140. Thus, groove 140 may have depth D and width W as shown in FIG. 1, sufficient volume, sufficient shape, and a perimeter around, greater than, or at the side surfaces of circuit device 260 to cause the surface tension of fill material 360 to be restrained from contacting or to contact only intermittently, portions of fill materials of adjacent circuit devices (e.g., such as to restrain fill material 360 from forming a bridge with fill material 370). For example, FIG. 4 shows grooves 140, 141, 142, and 143 around circuit device 260 and partially or completely filled with fill material 360. Moreover, according to embodiments, grooves 141, 142, 143, 150, 151, 152, and 153 may be formed by a process, have depth D, width W, a volume, a location, a proximity to sidewalls of circuit devices 260 and 270, and a cross-sectional shape as described above with respect to groove 140.

For example, as shown in FIG. 3, groove 140 may have a trapezoidal, rectangular, square, triangular, curved, or other appropriate cross-sectional shape with respect to the axis of channel 145 as shown in FIG. 4 (e.g., groove 140 has a square cross-sectional shape or profile with respect to the axis of channel 145 as shown in FIG. 4). Moreover, FIG. 4 shows grooves 140 through 143 extending in a square path around circuit device 260. It is contemplated that grooves 140 through 143 may be or represent grooves continuing around or forming a perimeter around a circuit device mounting location, package location, circuit device, or circuit device package in a trapezoidal, rectangular, square, curved or other appropriate perimeter or path. It is also considered that the perimeter or path of grooves 140 through 143 or a continuous groove as described above may be greater in perimeter or circumference than the perimeter, or sidewalls of circuit device mounting location 120 or circuit device 260. For example, as shown in FIG. 4, grooves 140 through 143 have a perimeter sufficient to enclose a circuit device mounted at circuit device mounting location 120.

According to embodiments, a mold or molding material 380 (shown as material under the dashed line) may be formed on structure 300. In addition, it is considered that structure 300 or portions thereof may be exposed to a temperature cycle process, a thermal treatment process, an annealing process, a chip attached reflow process, a capillary underfill (CUF) process, a molded encapsulation process, a ball attach (BA) process (e.g., such as a process related to solder balls as described above), a cooling process, and changes in temperature experienced during the lifetime of circuit device 260, or circuit device 270. As such, it is noted that reduction of fill materials 360 and 370 in channel 145 may reduce bowing or warpage of structure 300 or portions thereof during such processes and lifetimes.

It is also to be appreciated that apparatus 300 may be singulated or diced. For example, circuit devices 260 and 270 may be separated along channel 145 by dicing, such as by a singulation jig. It can be appreciated that such dicing or singulation may be performed along channel 145, such as along portions of channel 145 including exposed portions of surface 102, thus reducing damaging or cracking of substrate 105 along channel 145, to circuit device 260, circuit device 270, fill material 360, or fill material 370. Thus, groove 140 may reduce warpage of substrate 105 and cracking of circuit devices 260 by reducing expansion or extension of fill material 360 in direction DIR.

Figure 5:
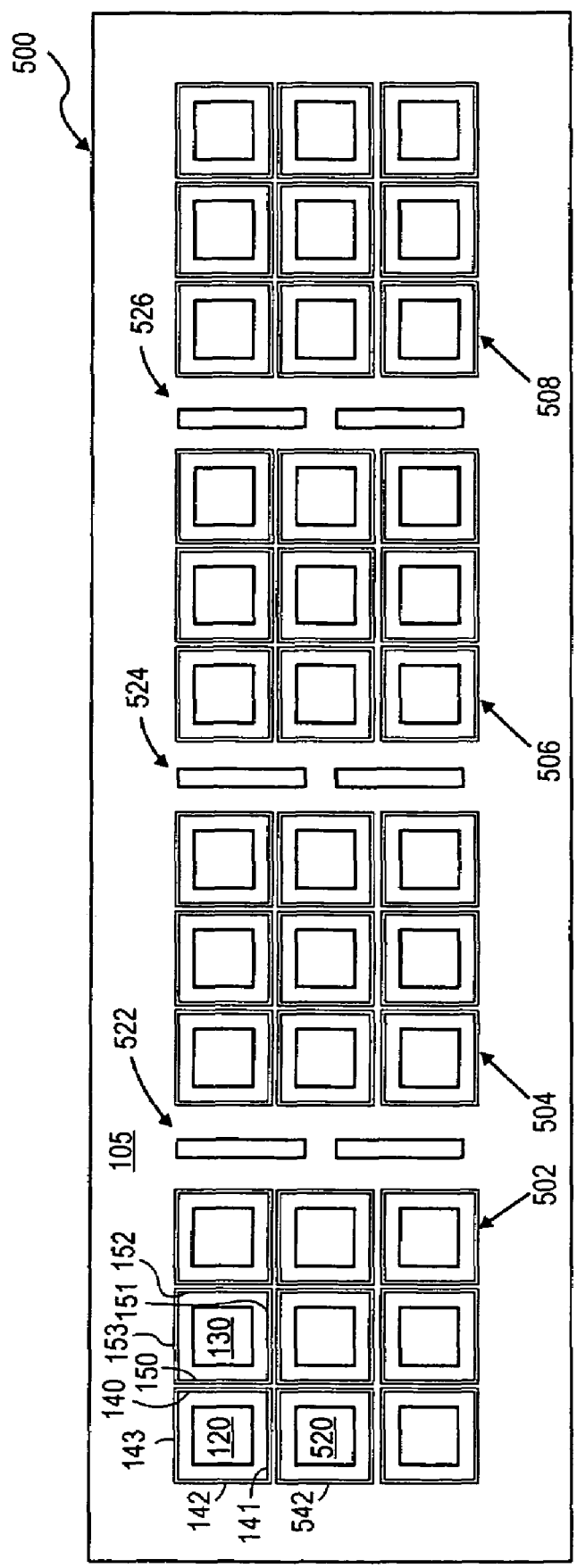
FIG. 5 is a schematic top perspective view of a circuit device according to embodiments of the invention.

For example, FIG. 5 is a schematic top perspective view of a circuit device according to embodiments of the invention. FIG. 5 shows apparatus 500 including clusters 502, 504, 506, and 508, where each cluster includes nine circuit device mounting locations. In addition, FIG. 5 shows border 522 between cluster 502 and 504, border 524 between cluster 504 and 506, and border 526 between cluster 506 and 508. Apparatus 500 may include substrate 105, or be a portion of substrate 105 as described above.

In addition, FIG. 5 shows groove 542 surrounding circuit device mounting location 520, such as where groove 542 represents for location 520 the function of grooves 140 through 143 with respect to location 120. Thus, it is contemplated that apparatus 500 may include multiple circuit device mounting locations such as four clusters of nine locations each, where each location is surrounded by a groove as described above with respect to groove 140. In one example, FIG. 5 shows location 120 surrounded by grooves 140 through 143. Furthermore, apparatus 500 may be a strip or strip substrate including clusters 502 though 508, such as a FCMMAP strip substrate with four clusters of nine package mounting locations each, where grooves around each mounting location reduce the amount of underfill material bridging between circuit devices attached at the locations (e.g., such as by draining some of the underfill material into the grooves and/or causing a surface tension of the underfill material to reduce bridging between underfill material of separate circuit devices), thus reducing warpage of apparatus 500 when circuit devices are attached thereto, and reducing damage to or layer separation of apparatus 500 and circuit devices in the packages formed therein, such as during singulation. Specifically, for example, FIG. 5 shows dashed lines 480 indicating a location where dicing, or singulation would occur to separate a package including device 260 from another package including device 270.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. A method comprising:
   forming a groove in a surface of a substrate adjacent and parallel to a sidewall location, the surface having a first circuit device mounting location including the sidewall location for a sidewall of a first circuit device to be mounted at the first circuit device mounting location;
   wherein the groove has a physical dimension to retain a portion of a fill material to be formed on the sidewall of the first circuit device, on the surface, and in the groove;
   wherein the first circuit device mounting location comprises a plurality of electrical contacts on the surface of the substrate suitable to electrically couple to a plurality of contacts on a bottom surface of the first circuit device;
   a second circuit device mounting location to mount a second circuit device on the surface, the second circuit device mounting location adjacent to the first circuit device mounting location;
   wherein the second location comprises a plurality of electrical contacts on the surface of the substrate suitable to electrically couple to a plurality of contacts on a bottom surface of the second circuit device.

2. The method of claim 1, wherein forming the groove comprises etching the surface.

3. The method of claim 1, wherein each of the first circuit device and the second circuit device is one of an integrated circuit (IC), a chip and die to be mounted on a substrate or a PCB.

4. The method of claim 1, wherein the substrate comprises a substrate material and the first fill material has a different coefficient of thermal expansion (CTE) than the substrate material.

5. A method comprising:
   forming a groove in a surface of a substrate, the groove along a channel defined by a space between a first circuit device mounting location and a second circuit device mounting location on the surface;
   mounting the first circuit device and the second circuit device on the substrate, the first circuit device having a sidewall towards the second circuit device;
   electrically coupling a plurality of electrical contacts on a bottom surface of the first circuit device to a plurality of contacts on the surface of the substrate at the first circuit device mounting location;
   electrically coupling a plurality of electrical contacts on a bottom surface of the second circuit device to a plurality of contacts on the surface of the substrate at the second circuit device mounting location;
   forming a fill material on the sidewall, on the surface of the substrate along the channel, and in the groove;

wherein a portion of the surface of the substrate in the channel is exposed.

6. The method of claim 5, wherein the first circuit device has a bottom surface towards the surface of the substrate and forming includes filling a space between the bottom surface and the surface of the substrate with the fill material.

7. The method of claim 5, wherein forming comprises one of a capillary filling process and underfill filling process.

8. The method of claim 5, wherein the groove is a first groove and the fill material is a first fill material, the method further comprising:
    forming a second groove in the channel, the second groove between the first groove and the second circuit device,
    forming a second fill material on a sidewall of the second circuit device, on the surface of the substrate along the channel and in the second groove;
    wherein a portion of the surface of the substrate between the first and second grooves is exposed.

9. The method of claim 8, wherein forming the first and second fill materials includes forming a sufficient amount of the first and second fill materials in the first and second grooves to restrain the first and second fill materials from bridging the portion of substrate between the first and second grooves.

10. The method of claim 8, wherein forming the first fill material includes creating a sufficient surface tension of the first fill material between the sidewall of the first circuit device and the surface of the substrate to restrain the first fill material from contacting the second fill material.

11. The method of claim 5, wherein forming the fill material includes creating a sufficient surface tension of the fill material between the sidewall and the surface of the substrate to reduce a size of a portion of the channel covered by the fill material.

12. The method of claim 5, further comprising forming a molding material on the fill material.

13. The method of claim 5, further comprising exposing the substrate to one of a temperature cycle process, a thermal treatment process, an annealing process, chip attach reflow (SCAM) process, capillary underfill (CUF) process, molded encapsulation process and a ball attach (BA) process.

14. The method of claim 5, further comprising at least one of thermally treating the fill material and cooling the fill material.

15. The method of claim 5, further comprising dicing the circuit devices, wherein dicing includes separating the first and second circuit device at the exposed substrate.

16. The method of claim 5, wherein the substrate comprises a substrate material and the fill material has a different coefficient of thermal expansion (CTE) than the substrate material.

17. An apparatus comprising:
    a substrate having a surface including a first circuit device mounting location and a groove extending in a rectangular path around the first circuit device mounting location, the rectangular path greater in dimension than a first circuit device to be mounted at the first location;
    wherein the first circuit device mounting location comprises a first plurality of electrical contacts on the surface of the substrate suitable to electrically couple to a plurality of contacts on a bottom surface of the first circuit device;
    the groove having a physical dimension to reduce extension on the surface beyond the groove, of a fill material to be formed on a sidewall of the first circuit device adjacent to the groove;
    a second circuit device mounting location to mount a second circuit device on the surface, the second circuit device mounting location adjacent to the first circuit device mounting location;
    wherein the second location comprises a second plurality of electrical contacts on the surface of the substrate suitable to electrically couple to a plurality of contacts on a bottom surface of the second circuit device.

18. The apparatus of claim 17,
    wherein the groove has a depth and a width sufficient to reduce bridging of the fill material between a first circuit device mounted at the first circuit device mounting location and a second circuit device mounted at the second circuit device mounting location.

19. The apparatus of claim 18, wherein the groove has one of a sufficient volume, a sufficient perimeter around the first circuit device mounting location, and a sufficient width and height to cause a surface tension of the fill material to be restrained from contacting the second circuit device.

20. The apparatus of claim 17, wherein the fill material to be formed comprises one of an underfill fillet material, a capillary fill material, and an epoxy material.

21. The apparatus of claim 17, wherein the substrate comprises a substrate material and the fill material has a different coefficient of thermal expansion (CTE) than the substrate material.

22. The apparatus of claim 17, wherein the groove is a first groove; and further comprising:
    a second groove surrounding the second circuit device mounting location,
    wherein the sidewall location is between the first and second circuit device mounting locations.

23. The apparatus of claim 22, further comprising a third groove surrounding a third circuit device mounting location in line with the first and second circuit device mounting locations, the third groove having a physical dimension to retain a portion of a fill material to be formed on a sidewall of a third circuit device to be mounted at the third circuit device mounting location.

24. The apparatus of claim 23, wherein the first, second and third grooves form a first column of grooves, further comprising:
    a second column of grooves adjacent to the first column of grooves;
    a third column of grooves adjacent to the second column of grooves;
    wherein the first, second, and third column of grooves form a first cluster of grooves, further comprising:
        a second cluster of grooves adjacent the first cluster of grooves;
        a third cluster of grooves in line with the first and second cluster of grooves.

25. The apparatus of claim 22, wherein a distance between the first and second circuit device packages is between 1 millimeter and 4 millimeters.

26. The apparatus of claim 17, wherein the groove has a rectangular cross-sectional shape with respect to an axis of the groove.

27. The apparatus of claim 17, wherein the groove extends to a depth of between 0.005 millimeters and 0.3 millimeters below a surface of the substrate, and has a width of between 0.005 millimeters and 0.3 millimeters.

* * * * *

UNITED STATES PATENT AND TRADEMARK OFFICE
CERTIFICATE OF CORRECTION

PATENT NO. : 7,179,683 B2 Page 1 of 1
APPLICATION NO. : 10/927568
DATED : February 20, 2007
INVENTOR(S) : Low et al.

It is certified that error appears in the above-identified patent and that said Letters Patent is hereby corrected as shown below:

In column 6, at line 36, delete "CUE" and insert --CUF--.

Signed and Sealed this

Twenty-fifth Day of December, 2007

JON W. DUDAS
*Director of the United States Patent and Trademark Office*